United States Patent
Ra et al.

(10) Patent No.: US 11,909,176 B2
(45) Date of Patent: Feb. 20, 2024

(54) NANOCRYSTAL SURFACE-EMITTING LASERS

(71) Applicant: The Regents of the University of Michigan, Ann Arbor, MI (US)

(72) Inventors: Yong-Ho Ra, Jinju (KR); Roksana Tonny Rashid, Montreal (CA); Xianhe Liu, Ann Arbor, MI (US); Zetian Mi, Ann Arobr, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 461 days.

(21) Appl. No.: 17/071,832

(22) Filed: Oct. 15, 2020

(65) Prior Publication Data
US 2021/0119420 A1    Apr. 22, 2021

Related U.S. Application Data

(60) Provisional application No. 62/915,432, filed on Oct. 15, 2019.

(51) Int. Cl.
| | |
|---|---|
| *H01S 5/34* | (2006.01) |
| *H01S 5/183* | (2006.01) |
| *H01S 5/11* | (2021.01) |
| *H01S 5/343* | (2006.01) |
| *H01S 5/30* | (2006.01) |
| *H01S 5/323* | (2006.01) |
| *H01S 5/32* | (2006.01) |

(52) U.S. Cl.
CPC ............... *H01S 5/341* (2013.01); *H01S 5/11* (2021.01); *H01S 5/183* (2013.01); *H01S 5/30* (2013.01); *H01S 5/320275* (2019.08); *H01S 5/32308* (2013.01); *H01S 5/34333* (2013.01)

(58) Field of Classification Search
CPC . H01S 5/341; H01S 5/11; H01S 5/183; H01S 5/30; H01S 5/320275; H01S 5/32308; H01S 5/34333
See application file for complete search history.

(56) References Cited

U.S. PATENT DOCUMENTS

| | | | | |
|---|---|---|---|---|
| 7,829,443 | B2 * | 11/2010 | Seifert | ............... H01L 29/0665 257/E33.025 |
| 2006/0280414 | A1 * | 12/2006 | Beausoleil | ............ G02B 6/107 385/125 |
| 2011/0204327 | A1 | 8/2011 | Hiruma et al. | |
| 2011/0309354 | A1 * | 12/2011 | Wang | ................ H01L 21/02472 257/E33.013 |

(Continued)

FOREIGN PATENT DOCUMENTS

| | | | | |
|---|---|---|---|---|
| KR | 20150040589 A | * | 4/2015 | ............ C09K 11/00 |
| WO | 2018141974 | | 8/2018 | |

OTHER PUBLICATIONS

English Translation of KR20150040589A (Year: 2015).*

(Continued)

*Primary Examiner* — Yuanda Zhang

(57) ABSTRACT

An all-epitaxial, electrically injected surface-emitting green laser operates in a range of about 520-560 nanometers (nm). At 523 nm, for example, the device exhibits a threshold current density of approximately 0.4 kilo-amperes per square centimeter ($kA/cm^2$), which is over one order of magnitude lower than that of previously reported blue laser diodes.

23 Claims, 8 Drawing Sheets

(56) References Cited

U.S. PATENT DOCUMENTS

| | | | |
|---|---|---|---|
| 2012/0205613 A1 | 8/2012 | Mi et al. | |
| 2016/0027961 A1* | 1/2016 | Mi | H01L 33/06 257/13 |
| 2016/0365480 A1* | 12/2016 | Mi | H01L 33/06 |
| 2019/0067900 A1 | 2/2019 | Bhattacharya et al. | |
| 2019/0237619 A1 | 8/2019 | Mi et al. | |
| 2019/0267775 A1 | 8/2019 | Noda et al. | |

OTHER PUBLICATIONS

Dong-Uk Kim et al., Free-Standing gaN-Based Crystal Bans-Edge Laser, IEEE Photonics Technology Letters. Oct. 15, 2011, vol. 23, No. 20, pp. 1454-1456 (Retrieved on Jan. 12, 2021). Retrieved from <https://ieeexplore.ieee.org/abstract/document/5961608>.

Kishino Katsumi et al: "Green-Light Nanocolumn Light Emitting Diodes With Triangular-Lattice Uniform Arrays of InGaN-Based Nanocolumns," IEEE Journal of Quantum Electronics, IEEE, USA, vol. 50, No. 7, Jul. 1, 2014, pp. 538-547.

Yong-Ho Ra et al.: "An electrically pumped surface-emitting semiconductor green laser," Science Advances, vol. 6, Jan. 3, 2020, pp. 1-8.

\* cited by examiner

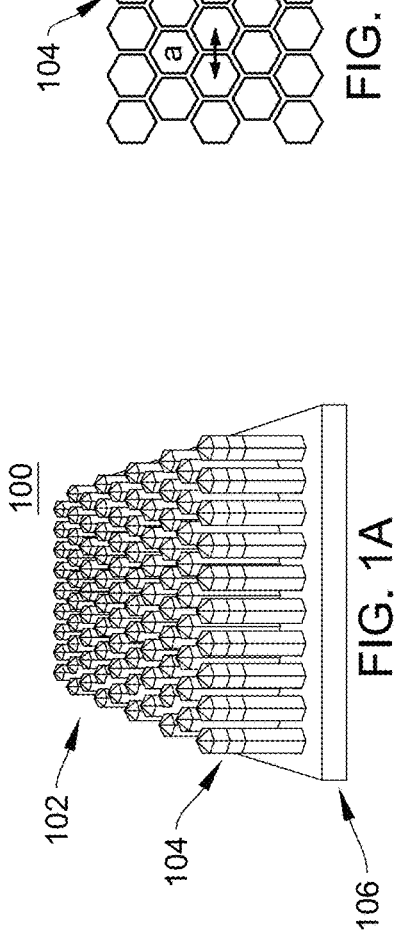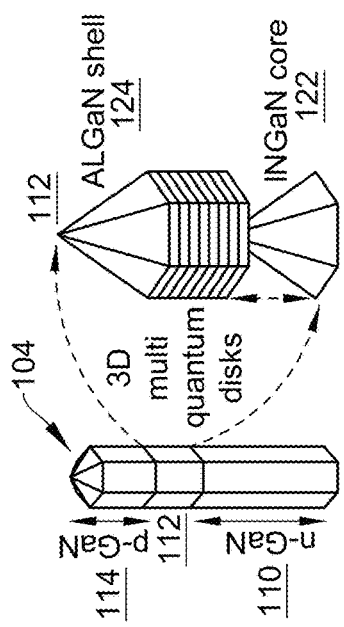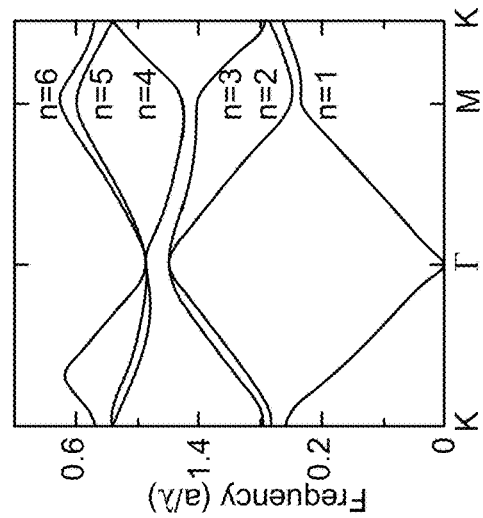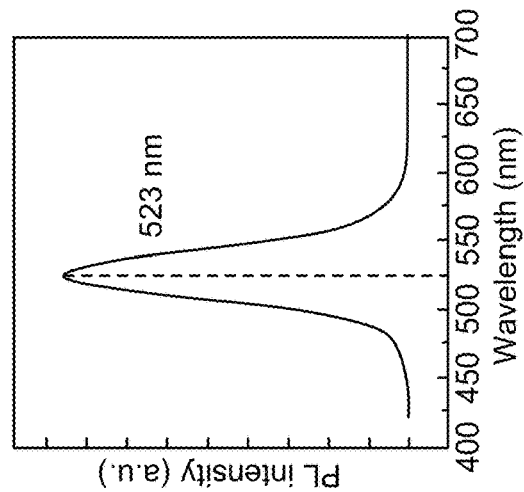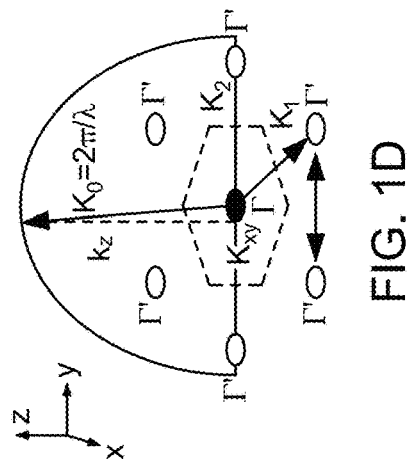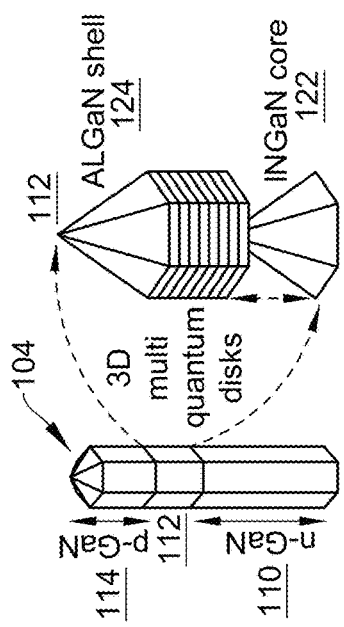
FIG. 1A
FIG. 1B
FIG. 1C
FIG. 1D
FIG. 1E
FIG. 1F

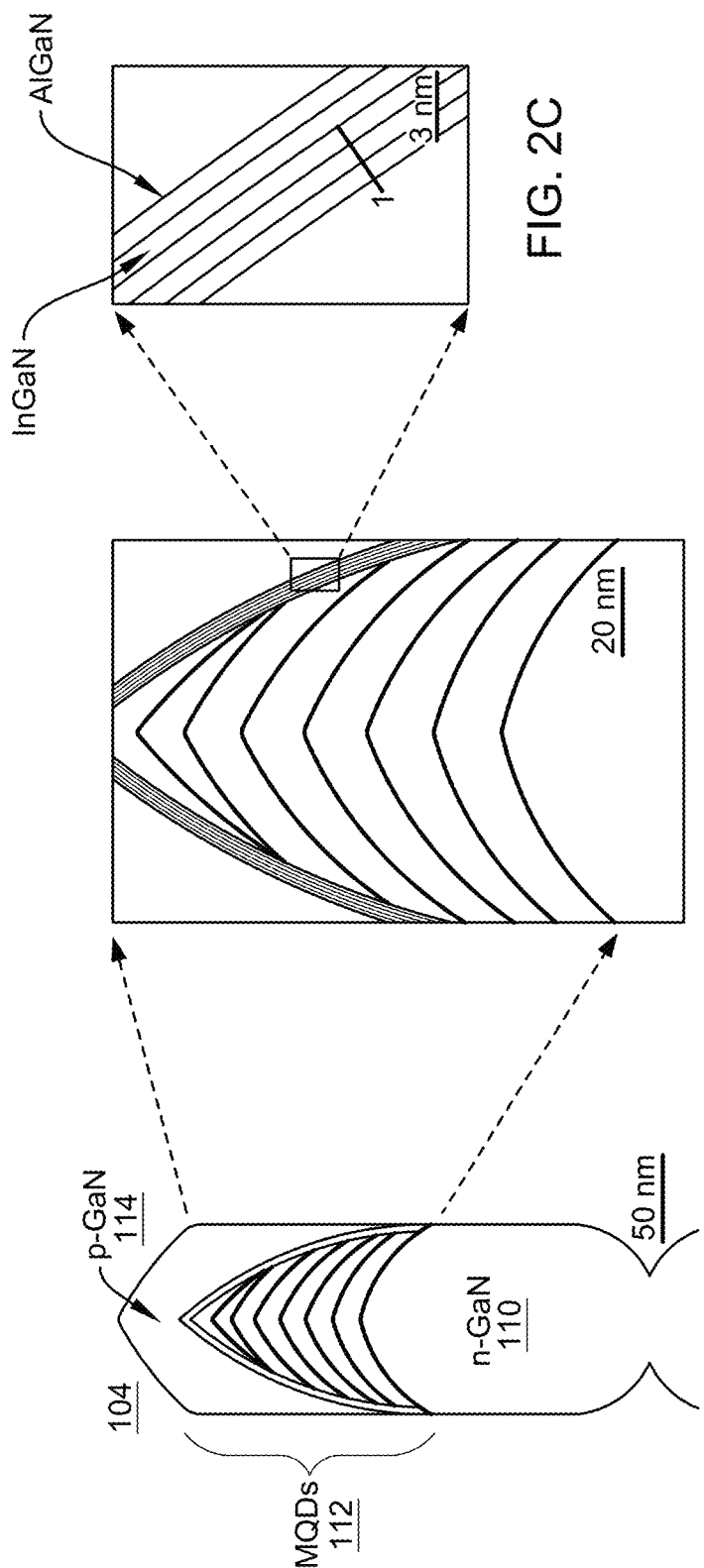

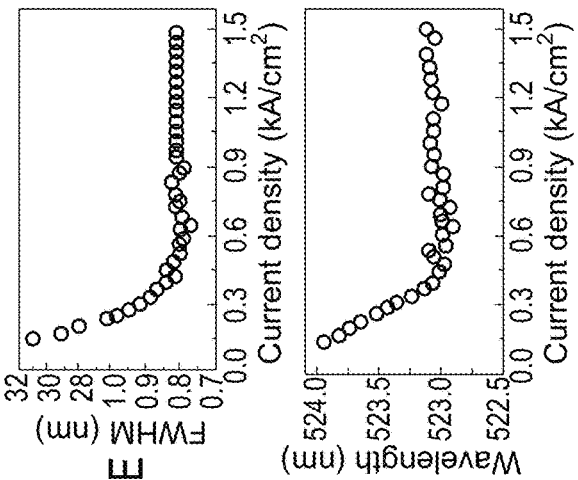
FIG. 3D
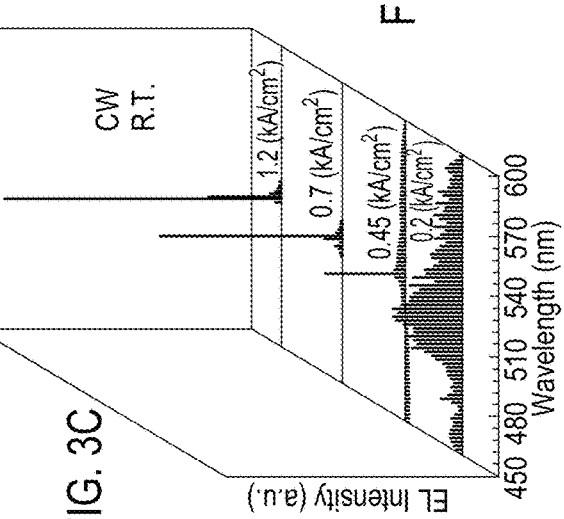
FIG. 3E
FIG. 3F
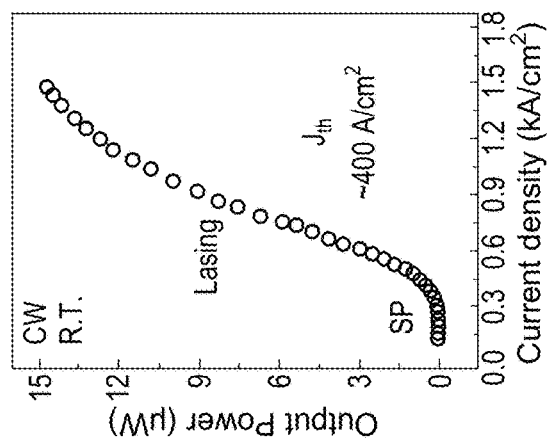
FIG. 3B
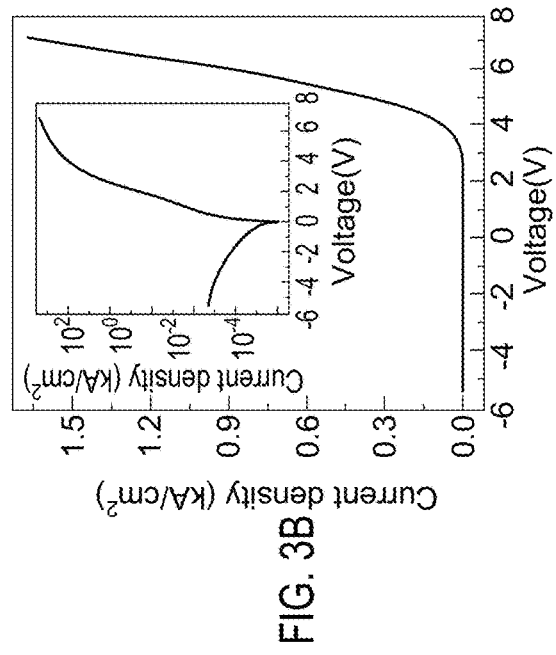
FIG. 3C
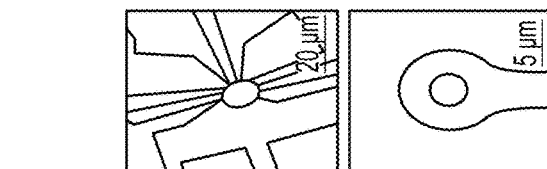
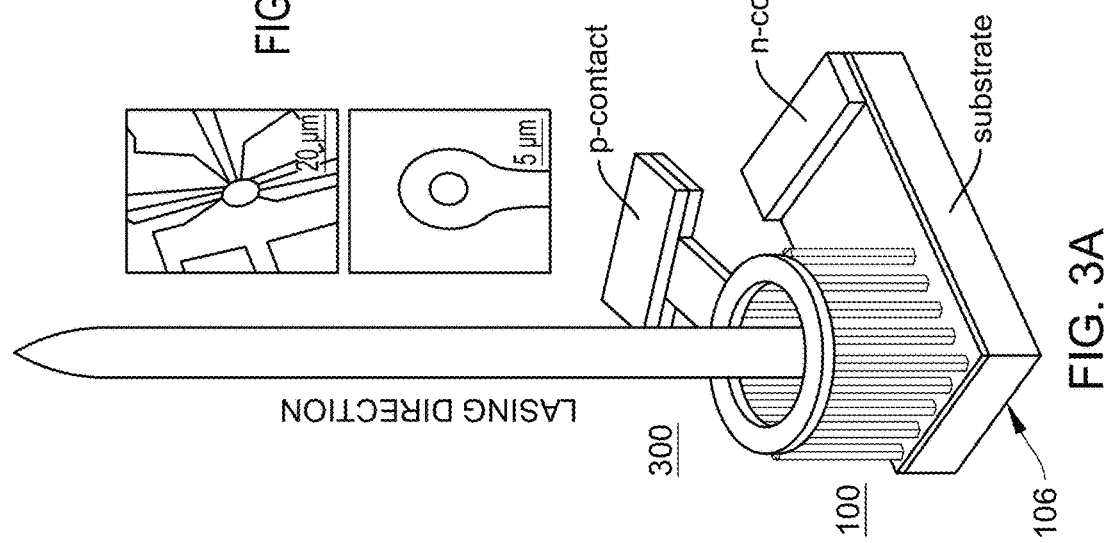
FIG. 3A 1. Nanocrystals grown on substrate 2. Polyimide passivation / Surface etching 3. Opening aperture by SiO$_2$ passivation layer 4. Thin metal contact / ITO deposition 5. Metallic electrode contact grids

NANOCRYSTAL SURFACE-EMITTING LASERS

RELATED U.S. APPLICATION

This application claims priority to the U.S. Provisional Application entitled "Electrically Pumped Surface-Emitting Semiconductor Green Laser," by Yong-Ho Ra et al., Ser. No. 62/915,432, filed Oct. 15, 2019, hereby incorporated by reference in its entirety.

STATEMENT PER 35 U.S.C. 202(c)(6)

This invention was made with government support under ECCS1709207 awarded by the National Science Foundation, and under W911NF-17-1-0388 awarded by the U.S. Army/Army Research Office. The government has certain rights in the invention.

BACKGROUND

Vertical cavity surface-emitting laser (VCSEL) diodes, first presented in 1979, emit a coherent optical beam vertically from the device top surface and offer a number of advantages compared to conventional edge-emitting lasers, including lower threshold currents, circular and low-divergence output beams, single longitudinal mode emission, longer lifetime, and easier production of dense two-dimensional arrays. Commercial VCSELs are fabricated on gallium arsenide (GaAs) and indium phosphorus (InP) substrates, which emit light mostly in the near-infrared wavelengths. Semiconductors based on gallium nitride (GaN) are the choice for lasers operating in the visible and ultraviolet spectral ranges, and significant efforts have been devoted to developing GaN-based VCSELs. However, operating wavelengths have been largely limited to the blue spectral range.

Dual dielectric distributed Bragg reflectors (DBRs) are an essential component of conventional VCSELs. DBRs consist of multiple alternative layers of materials with a relatively large difference in refractive index to provide very high reflectivity. DBRs with nearly lattice-matched layers can be formed in GaAs-based and InP-based systems, but have remained a critical challenge for GaN-based systems. The large lattice mismatch between GaN and AlN (about 2.5 percent) and between GaN and InN (about 11 percent), together with the difficulty in achieving efficient p-type conduction, leads to GaN-based DBRs with high electrical resistivity, large densities of defects and dislocations, and relatively low reflectivity. In addition, the presence of a strong polarization field and the resulting quantum-confined Stark effect (QCSE) of conventional c-plane GaN devices further reduce the rate of radiative recombination, resulting in higher thresholds and unstable operation. To address these issues, GaN-based blue VCSELs have been reported by utilizing AlInN/GaN DBRs or dual-dielectric DBRs, and by growing the devices on an m-plane GaN substrate. The resulting devices, however, still exhibit very large threshold current density ($J_{th}$ greater than ten kilo-amperes per square centimeter) at room temperature, with operating wavelengths still limited to 400-460 nanometers (the blue spectral range).

To date, there has not been a demonstration of all-epitaxial surface-emitting laser diodes operating in the green wavelength range, to which human eyes are most sensitive. A previously reported room-temperature continuous wave (RTCW) surface-emitting green laser diode relied on the use of DBRs and wafer bonding to a copper plate for low thermal resistance. The realization of a low current threshold, high efficiency, all-epitaxial surface-emitting green laser diode will enable many exciting applications including projection displays such as pico-projectors, plastic optical fiber communication, wireless communication, optical storage, smart lighting, and biosensors. Surface-emitting semiconductor lasers have been widely used in data communications, sensing, facial identification, and augmented reality glasses.

SUMMARY

Disclosed herein are all-epitaxial, electrically injected nanocrystal surface-emitting lasers (NCSELs) that do not necessarily use distributed Bragg reflectors (DBRs). In embodiments, the devices operate in a range of about 520-560 nanometers (nm), the green wavelength range. At 523 nm, for example, the devices exhibit a threshold current density $J_{th}$ of approximately 0.4 kilo-amperes per square centimeter ($kA/cm^2$), which is over one order of magnitude lower compared to that of previously reported blue laser diodes. Consequently, low threshold surface-emitting laser diodes can operate at wavelengths from the ultraviolet to the deep visible (about 200-600 nm), and device performance is no longer limited by the lack of high quality DBRs, large lattice mismatch, and substrate availability. The NCSELs disclosed herein can be used to achieve ultra-small semiconductor lasers that can improve the efficiency and resolution of displays by ten to 100 times.

These and other objects and advantages of the various embodiments of the present invention will be recognized by those of ordinary skill in the art after reading the following detailed description of the embodiments that are illustrated in the various drawing figures.

BRIEF DESCRIPTION OF DRAWINGS

The accompanying drawings, which are incorporated in and form a part of this specification and in which like numerals depict like elements, illustrate embodiments of the present disclosure and, together with the detailed description, serve to explain the principles of the disclosure. The drawings are not necessarily to scale.

FIG. 1A illustrates a monolithic device in embodiments according to the present invention.

FIG. 1B is a top-down view of a nanocrystal array in embodiments according to the present invention.

FIG. 1C illustrates a structure of a nanowire in embodiments according to the present invention.

FIG. 1D illustrates the reciprocal lattice of a photonic nanocrystal structure in embodiments according to the present invention.

FIG. 1E illustrates the photonic band structure of a nanocrystal surface-emitting laser (NCSEL) in embodiments according to the present invention.

FIG. 1F shows the photoluminescence (PL) spectrum measured at room temperature of a nanocrystal or nanowire in embodiments according to the present invention.

FIG. 2A shows the high-angle annular dark-field (HAADF) atomic-number contrast image of a representative nanocrystal in embodiments according to the present invention.

FIG. 2B is a high-magnification image of a region of the image in FIG. 2A.

FIG. 2C shows the high-magnification HAADF image of the active region of a nanocrystal in embodiments according to the present invention.

FIG. 3A illustrates a NCSEL in embodiments according to the present invention.

FIG. 3B shows an example of a current-voltage curve of the NCSEL of FIG. 3A.

FIG. 3C shows the electroluminescence (EL) spectra of the NCSEL of FIG. 3A.

FIG. 3D shows variations in the output power versus injection current for the NCSEL of FIG. 3A.

FIGS. 3E and 3F illustrate variations of spectral linewidth and wavelength peak position, respectively, under different injection current densities for the NCSEL of FIG. 3A.

DETAILED DESCRIPTION

Figure 1G:
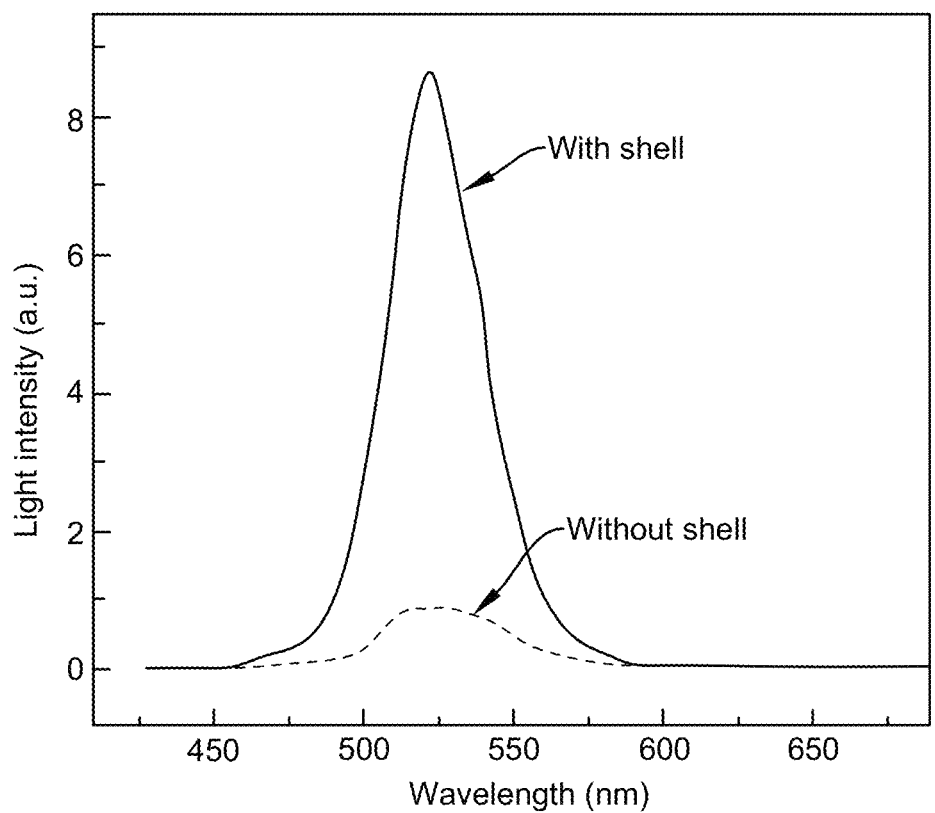
FIG. 1G shows the PL emission spectra of a core-shell multi-quantum disk nanocrystal in embodiments according to the present invention and of a conventional multi-quantum disk nanocrystal.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The figures are not necessarily drawn to scale, and only portions of the devices and structures depicted, as well as the various layers that form those structures, are shown. For simplicity of discussion and illustration, only one or two devices or structures may be described, although in actuality more than one or two devices or structures may be present or formed. Also, while certain elements, components, and layers are discussed, embodiments according to the invention are not limited to those elements, components, and layers. For example, there may be other elements, components, layers, and the like in addition to those discussed.

Some portions of the detailed descriptions that follow are presented in terms of procedures and other representations of operations for fabricating devices like those disclosed herein. These descriptions and representations are the means used by those skilled in the art of device fabrication to most effectively convey the substance of their work to others skilled in the art. In the present application, a procedure, operation, or the like, is conceived to be a self-consistent sequence of steps or instructions leading to a desired result. operations described as separate blocks may be combined and performed in the same process step (that is, in the same time interval, after the preceding process step and before the next process step). Also, the operations may be performed in a different order than the order in which they are described below. Furthermore, fabrication processes and steps may be performed along with the processes and steps discussed herein; that is, there may be a number of process steps before, in between, and/or after the steps shown and described herein. Importantly, embodiments according to the present invention can be implemented in conjunction with these other (perhaps conventional) processes and steps without significantly perturbing them. Generally speaking, embodiments according to the present invention can replace portions of a conventional process without significantly affecting peripheral processes and steps.

The present disclosure introduces a nanocrystal surface-emitting laser (NCSEL) diode that does not necessarily include distributed Bragg reflectors (DBRs) or the like (e.g., Bragg mirrors or dielectric mirrors), and that can operate efficiently in the green spectrum.

FIG. 1A illustrates a monolithic device 100 that includes a nanocrystal array 102 on a substrate 106 in embodiments according to the present invention. A monolithic device is a device that has a single substrate; that is, the nanocrystal array 102 is fabricated on a single substrate, and the nanocrystal array is not separated from that substrate when incorporated into, for example, a laser.

The nanocrystal array 102 includes a number of nanocrystals, or nanowires, 104 (each nanowire is a nanocrystal, and the array of nanocrystals includes an array of nanowires, and so these terms may be used interchangeably herein). FIG. 1B is a top-down view of the array 102 in embodiments according to the present invention. The size, spacing, and surface morphology of the nanowires 104 in the array 102 are precisely controlled. Each of the nanowires 104 has a hexagonal shape; that is, they each have a transverse cross-section that is hexagonal. The array 102 includes multiple rows of nanowires, with each row including multiple nanowires. In an embodiment, the nanowires 104 in the array 102 are arranged in a triangular lattice. The diameter and lattice constant of the nanowires 104 are denoted as d and a, respectively, in FIG. 1B. In an embodiment, the nanowires 104 have a spacing (gap) of approximately 30 nanometers (nm) between neighboring nanowires, a height of approximately 600 nm, a lateral size of approximately 230 nm, and the lattice constant (pitch) is approximately 250 nm. The nanowires 104 exhibit uniform length, smooth sidewalls, and high (depth-to-width) aspect ratio. Due to the efficient strain relaxation, the nanostructures of the nanowires 104 are free of dislocations.

FIG. 1C illustrates the structure of a nanowire 104 in embodiments according to the present invention. In embodiments, the nanowire 104 includes an n-doped gallium nitride (n-GaN) cladding layer or region 110, a heterostructure or active region 112, and a p-doped GaN (p-GaN) cladding layer or region 114. (The active region 112 includes the disclosed heterostructure, and these terms may be used interchangeably herein.) In embodiments, the active region 112 is an indium-GaN and aluminum-GaN (InGaN/AlGaN) core-shell heterostructure that includes multiple InGaN quantum disks 122 in the active region. In embodiments, the n-type GaN cladding layer 110 is approximately 370 nm thick (measured in the longitudinal direction of the nanowire 104), and the p-type GaN cladding layer 114 is approximately 190 nm thick; however, the invention is not so limited.

FIG. 1C also illustrates an expanded view of the heterostructure (active region) 112 in embodiments according to the present invention. The quantum disks 122 are incorporated on semipolar planes of the active region 112, which can significantly reduce the quantum-confined Stark effect (QCSE). A unique AlGaN shell structure 124 is also disposed on a semipolar plane surrounding the quantum disks 122 as shown in FIG. 1C. The shell structure 124 suppresses surface recombination.

Because the quantum disks 122 and the shell structure 124 are disposed on semipolar planes of the nanowire 104, the heterostructure 112 is generally cone-shaped or pyramid-shaped, and is narrower as distance from the substrate 106 (FIG. 1A) increases. The unique three-dimensional (3D) structure of the active region 112 provides an emission area that is two times larger than that of conventional quantum disk/dot active regions aligned vertically in horizontal planes.

In embodiments, the shell structure 124 is interleaved with the quantum disks 122. That is, in embodiments, the shell structure 124 includes multiple layers, and each shell layer (except for the outermost shell layer) is disposed between two quantum disks (and as such, each quantum disk is disposed between two shell layers).

The shell structure 124 spontaneously forms on the sidewalls of the active region 112 during fabrication (see the discussion accompanying FIG. 6A, below). This results in drastically reduced non-radiative surface recombination due to the effective lateral confinement offered by the large band-gap AlGaN shell 124. Moreover, the unique quasi-3D structure of the active region 112 exhibits massively enhanced surface emission and improved carrier injection efficiency, due to the much larger surfaces of the active area. Such a semipolar structure can effectively suppress QCSE due to the reduced polarization fields.

The nanowires 104 emit light (laser light, e.g., light by stimulated emission or population inversion) having wavelengths in a range of 520-560 nanometers (the green spectral range) at a threshold current density that is at least an order of magnitude less than ten kiloamperes per square centimeter ($kA/cm^2$). In embodiments, the nanowires 104 operate at 523.1 nm at a threshold current density on the order of approximately 400 $A/cm^2$ and less, and exhibit highly stable operation at room temperatures.

In an embodiment, the substrate 106 (FIG. 1A) is light-transmissive; that is, light produced by the nanocrystal array 102 can pass through the substrate. In another embodiment, the substrate is not light-transmissive (e.g., it is opaque).

The nanocrystal array 102 exhibits a photonic band-edge resonant effect. The nanocrystal array 102 can be utilized to produce electrically injected nanocrystal surface-emitting lasers, referred to herein as NCSELs. In particular, the nanocrystal array 102 can be utilized to produce NCSELs that operate in the green spectral range, although the invention is not so limited. Embodiments according to present invention introduce a viable approach that can achieve high performance surface-emitting laser diodes from the deep ultraviolet (UV) range to the deep visible range (e.g., approximately 200-600 nm). Significantly and advantageously, such laser diodes are achieved without necessarily using conventional thick and high-resistivity DBRs or the like. The achievement of coherent lasing oscillation is confirmed by the far-field emission pattern and by detailed polarization measurements.

Design and simulation of the NCSELs disclosed herein, including energy band diagram and mode profile, were performed using a two-dimensional finite-element method (2D-FEM) simulation with Maxwell's equations (see also FIG. 5 and the accompanying discussion, below). FIG. 1D illustrates the reciprocal lattice of a photonic nanocrystal structure in embodiments according to the present invention. The reciprocal lattice of the photonic crystal structure has six equivalent gamma (Γ') points in the Brillouin zone, which are coupled together by the Bragg grating vectors (e.g., $K_1$ and $K_2$). The corresponding wavelength of light forms a standing wave resonant in the photonic crystal without a DBR (e.g., dielectric mirror). In addition to such in-plane coupling, there is also out-of-plane coupling between the six Γ' points and the Γ point that has a zero in-plane wavevector. The wavevector is essentially vertical, thereby leading to surface emission.

FIG. 1E illustrates the photonic band structure of NCSELs disclosed herein, calculated from a 2D-FEM simulation for transverse magnetic (TM) polarization (E ∥c-axis). The Γ point in the fourth band is located at approximately 0.48 a/λ (where a is the lattice constant, and λ is wavelength), which corresponds to a wavelength of about 520 nm. The group velocity is determined by the slope of the dispersion curve in the photonic band structure. At the band edge, the low group velocity is achieved when the slope of dispersion curve become zero (e.g., near the Γ point, the group velocity of light becomes zero (dw/dk→0)), thereby leading to the formation of a stable and large single-cavity mode. The mode intensity is mostly distributed in the nanocrystals (the nanowires 104 of FIG. 1C). The extremely low group velocity leads to a long interaction time between radiation field and active material, and consequently gives rise to a strong gain enhancement. Photons are also confined around the active region 112 in the vertical direction, due to the higher average refractive index in the active region. The mode intensity profile in the vertical direction is shown in FIG. 5.

Figure 5:
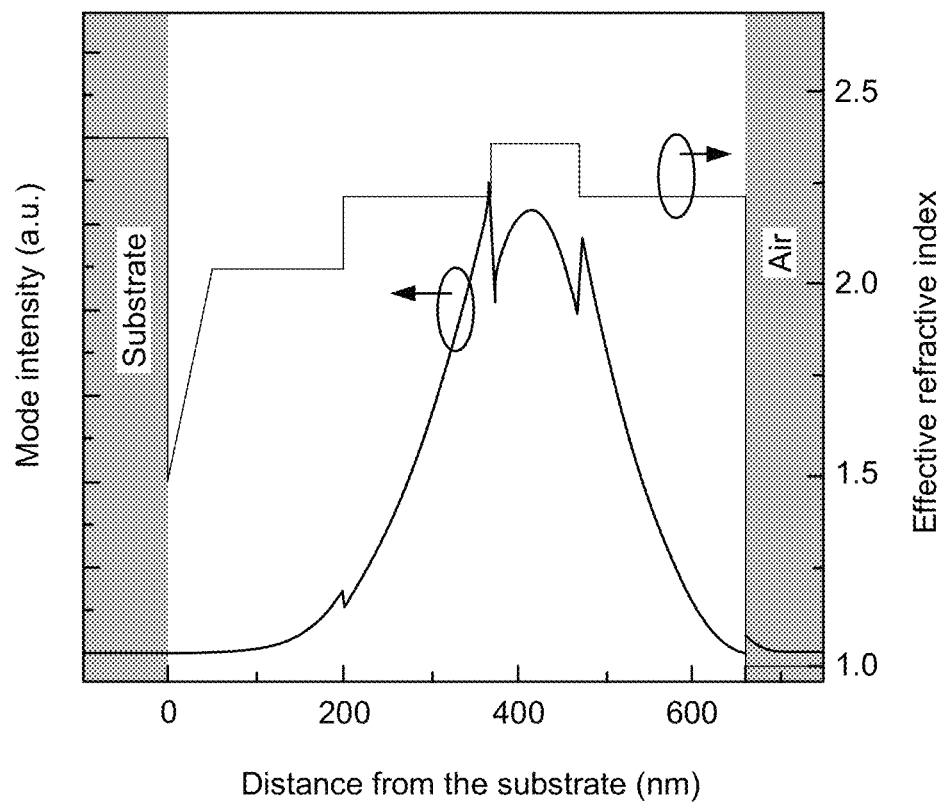
FIG. 5 shows the variation of the effective refractive index for a NCSEL in embodiments according to the present invention.

FIG. 5 shows the variation of the effective refractive index along the growth direction and the TM polarized mode intensity profile for NCSELs in embodiments according to the present invention. Due to larger refractive index for InGaN compared to GaN, the effective refractive index is higher around the active region. The effective refractive index is calculating assuming the nanocrystals have a flat top morphology, the lattice constant is 250 nm, the spacing between nanocrystals is 30 nm, and the refractive index is 1.75 for the filling material (polyimide), 2.69 for InGaN, 2.35 for AlGaN, and 2.38 for n-GaN and p-GaN. The diameter of the nanocrystals is approximated to grow from 170 nm to 255 nm within a height of 50 nm. Due to the high viscosity of the filling material and the small spacing between nanocrystals, air gaps exist near the root of the GaN nanocrystals. Considering the lengths of the segments in FIG. 1A, the variation of the effective refractive index in the vertical direction and the corresponding TM polarized mode are calculated as shown in FIG. 5. The mode is mostly confined near the active region 112 (FIG. 1C) due to the higher refractive index.

The realization of NCSELs as disclosed herein requires a precise control of the nanocrystal (nanowire) size, spacing, and uniformity across a relatively large area. The fabrication of the nanocrystal array 102 (FIG. 1A) is achieved by a special technique of selective area epitaxy using plasma-assisted molecular beam epitaxy (MBE) (see also FIGS. 7A and 7B and the accompanying discussion, below).

FIG. 1F shows the photoluminescence spectrum measured at room temperature of a nanocrystal or nanowire 104 (FIG. 1C) in embodiments according to the present invention. The peak emission wavelength is approximately 523 nm. Significantly enhanced photoluminescence (PL) emission intensity was measured for the InGaN/AlGaN core-shell structure disclosed herein, compared to similar structures but without an AlGaN shell.

FIG. 1G shows the PL emission spectra of an InGaN/AlGaN core-shell multi-quantum disk nanocrystal 104 (FIG. 1C) and of a conventional InGaN/GaN multi-quantum disk nanocrystal without an AlGaN shell, in embodiments according to the present invention. The PL spectra shown in FIG. 1G is measured at room temperature (300 degrees Kelvin (° K)) using a 405 nm laser as the excitation source. The PL intensity of the semipolar InGaN/AlGaN core-shell 112 (FIG. 1C) is enhanced by nearly a factor of eight compared to the conventional InGaN/GaN heterostructure without the AlGaN shell.

FIG. 2A shows the high-angle annular dark-field (HAADF) atomic-number contrast image of a representative InGaN nanocrystal (nanowire) 104 in embodiments according to the present invention. The InGaN/AlGaN heterostructure 112 is formed as a cone or in a cone-like shape. This is due to the formation of n-GaN nanocrystals that have a Ga-polarity and pyramid-like morphology as described above. The resulting unique structure takes advantage of the semipolar effect in the active region 112 to reduce the polarization field in GaN wurtzite structures.

FIG. 2B is a high-magnification image taken from the marked region in FIG. 2A. The sloping, multiple quantum disk layers 112 can be more clearly observed in FIG. 2B. The formation of multiple quantum disk heterostructures on semipolar planes of [0113] orientation is further supported by a representative selective area electron diffraction (SAED) pattern analysis.

Due to the quasi-3D structure of the InGaN/AlGaN multi-quantum disk layers 112, the transmission electron microscopy (TEM) images have different projection effects from the different layers. From the wide-thickness layers with the bright contrast in the middle region of FIG. 2B, it can be seen that multiple quantum disk and shell structures are formed in a cone-like structure as described above. The formation of such a cone-shaped active layer is further supported by the formation of the n-GaN structure as described above. The unique 3D structure provides an emission area that is two times larger than that of the typical quantum disk/dot active regions aligned vertically with the same diameter.

FIG. 2C shows the high-magnification HAADF image of InGaN/AlGaN active region 112 (FIG. 2A) in embodiments according to the present invention. The presence of highly uniform multiple quantum disk layers can be clearly identified by different levels of contrast. No noticeable extended misfit dislocations or stacking faults are observed. The thicknesses of the InGaN disks 122 and AlGaN barriers 124 of FIG. 2C are approximately 2.5 nm and approximately 1.5 nm, respectively; however, the invention is not so limited.

To further confirm elemental distribution of the active region 112, an energy dispersive x-ray spectrometry (EDXS) analysis was performed along the growth direction of the InGaN/AlGaN heterostructure 112, which is labeled as "1" in FIG. 2C. Because the atomic number of Al is smaller than the atomic number of In, it has a darker contrast in the TEM image. The In signal exhibits a maximum in the brighter regions and drops in the darker regions. In contrast, the Al signal shows clear peaks in the darker regions, confirming the formation of InGaN/AlGaN quantum disk and shell heterostructures.

The presence of the Al-rich AlGaN shell layer 124 formed spontaneously on the sidewall(s) of the InGaN quantum disk(s) 122 is also confirmed by EDXS point analysis. The spontaneously formed AlGaN shell structure 124 can effectively suppress nonradiative surface recombination, a primary limiting factor for the performance of conventional nanostructure devices.

Moreover, the semipolar InGaN/AlGaN core-shell heterostructure 112 offers several distinct advantages, including significantly reduced polarization fields and enhanced light emission efficiency, as well as significantly improved carrier injection efficiency and luminescence efficiency, compared to conventional quantum disk/dot structures (see FIG. 1G and the accompanying discussion). Such a unique structure cannot be fabricated by conventional top-down approaches because the active region is predefined by the film structure.

FIG. 3A illustrates a NCSEL 300 that includes the monolithic device 100, as well as other components (see FIG. 6F and the accompanying discussion, for example), in embodiments according to the present invention. The NCSEL 300 can be fabricated using planarization, polyimide passivation, contact metallization, and photolithography techniques as described below in conjunction with FIGS. 6A-6E. The NCSEL 300 emits laser light in the vertical direction (in the orientation of FIG. 3A), away from the substrate 106 as shown in the figure.

FIG. 3B shows an example of a current-voltage (I-V) curve of the NCSEL 300 with an example surface area of approximately 25 square micrometers ($\mu m^2$), in embodiments according to the present invention. The I-V curve shows rectification characteristics with a sharp turn-on voltage of approximately 3.3 V at room temperature. The leakage current is negligible under reverse bias, as shown in the inset of FIG. 3B, which shows current density versus voltage in embodiments according to the present invention. The NCSEL 300 exhibits excellent I-V characteristics, which is partly due to the significantly reduced defect density and enhanced dopant incorporation in the nanocrystals 104 of the device. The emitted light is emitted from the top surfaces of the nanocrystals (nanowires) 104 (FIG. 1A).

FIG. 3C shows the electroluminescence (EL) spectra of the NCSEL 300 measured under different injection currents, in embodiments according to the present invention. At a low injection current density of approximately 200 A/cm$^2$, the device exhibits a broad emission spectrum centered at a wavelength of approximately 524 nm, with a full-width-at-half-maximum (FWHM) of approximately 30 nm, which corresponds to the spontaneous emission of the active region 112 (FIG. 1C). A sharp lasing peak at a wavelength of approximately 523.1 nm is observed with increasing injection current, with a narrow linewidth of approximately 0.8 nm. The strong lasing spot is shown in the inset of FIG. 3A, recorded at a current density approximately one kA/cm$^2$. Variations of the output power versus injection current exhibit a clear threshold at approximately 400 A/cm$^2$, as shown in FIG. 3D. The measured lasing threshold is significantly lower compared to conventional GaN-based vertical cavity surface-emitting lasers (VCSELs). An output power of approximately 12 micro-watts ($\mu$W) was measured at an injection current density of approximately one kA/cm$^2$ under continuous wave operation. The output power shows saturation with increasing injection current, due to heating effects. The measured output power is significantly higher than previously reported values of GaN-based VCSELs operating at 460 nm and 500 nm.

FIGS. 3E and 3F illustrate variations of spectral linewidth (FWHM) and wavelength peak position, respectively, under different injection current densities, in embodiments according to the present invention. In these examples, the spectral linewidth decreases from approximately 30 nm to 0.8 nm at the threshold current density. It is also seen that the lasing peak position stays nearly constant at approximately 523 nm above that threshold, suggesting highly stable lasing of the NCSELs disclosed herein. The low threshold current density and highly stable emission are directly related to the robust photonic band edge mode of the nanocrystal optical cavity, the dislocation-free bottom-up nanocrystal structure, and the reduced nonradiative surface recombination and suppressed polarization-field with the extended emission area in the InGaN/AlGaN cone-like shell active region 112 (FIG. 1C).

The far-field radiation pattern of the nanocrystal laser structure disclosed herein was simulated using a 3D finite-difference time-domain (FDTD) method. Because the wavelength near the Γ point has a very small in-plane wavevector component, the wavevector is expected to be almost vertical. Due to that unique property of the Γ point, the far field pattern indeed exhibits a spot in the center with a very small divergence angle, which corresponds to highly collimated vertical emission.

The far-field patterns were measured with current densities below and above the threshold of the NCSELs disclosed herein. Below the threshold, the far-field image shows nearly uniform emission without any interference fringes, suggesting the formation of a highly uniform band edge mode in the nanocrystal array. When the current density is above the threshold, the lasing emission shows the presence of interference fringes that indicate coherent emission. Such results provide strong evidence that the coherent lasing oscillation has been achieved in the nanocrystal arrays disclosed herein.

Figure 4A:
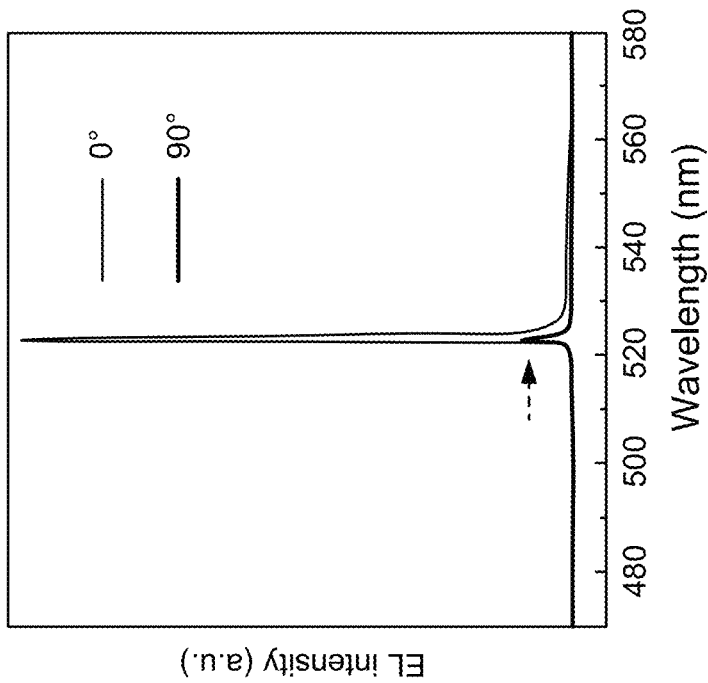
FIG. 4A shows the EL spectra for different polarizations for a NCSEL in embodiments according to the present invention.
Figure 4B:
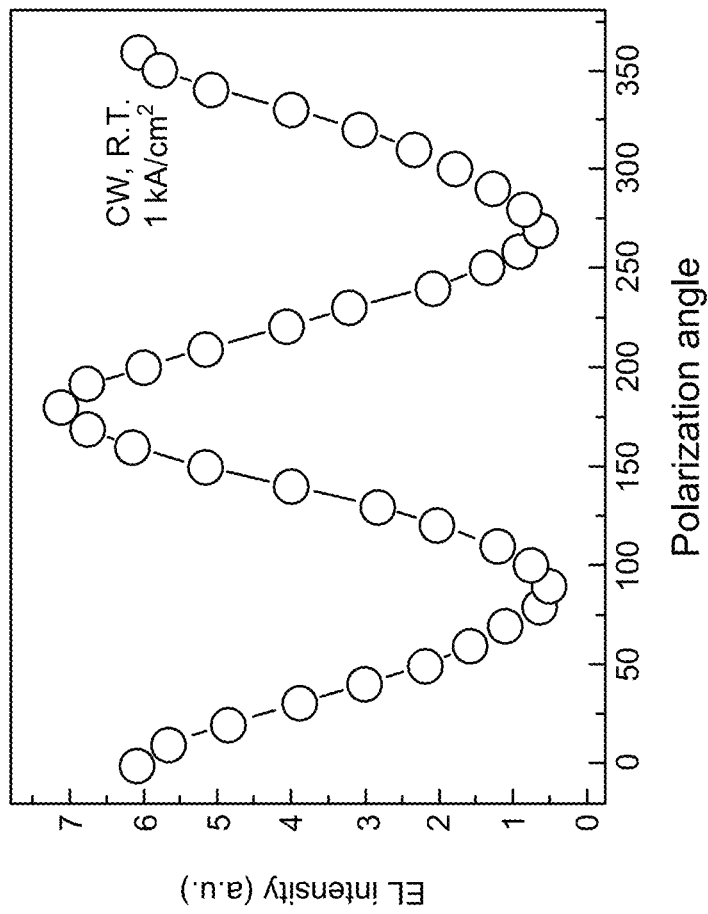
FIG. 4B illustrates variations of EL intensity versus polarization angle for a NCSEL in embodiments according to the present invention.

The polarization properties in the far-field of light emission of NCSELs disclosed herein was studied. The degree of polarization is defined as $\rho=(I_{0°}-I_{90°})/(I_{0°}+I_{90°})$, where $I_{0°}$ and $I_{90°}$ are the EL emission intensity corresponding to the electric field along zero degrees (0°) and 90° direction, respectively. FIG. 4A shows the EL spectra measured under a current density of one $kA/cm^2$ for different polarizations for embodiments according to the present invention. The EL emission is highly polarized. The degree of polarization is as large as 0.86. Variations of EL intensity versus polarization angle (θ) are further plotted in FIG. 4B for embodiments according to the present invention, showing a high degree of polarization at θ=0°. This is a remarkably stable and directional polarized emission compared to conventional photonic crystal laser devices. These studies provide unambiguous evidence for the achievement of a surface-emitting laser.

FIGS. 6A-6F illustrate an example of steps used to fabricate an NCSEL 600 that includes the monolithic device 100 of FIG. 1A in embodiments according to the present invention. The NCSEL 600 is an example of the NCSEL 300 previously discussed herein (see FIGS. 3A-3F and the accompanying discussion). Where certain materials (elements), dimensions, and values are included in the discussion below, the present invention is not so limited.

Figure 6A:
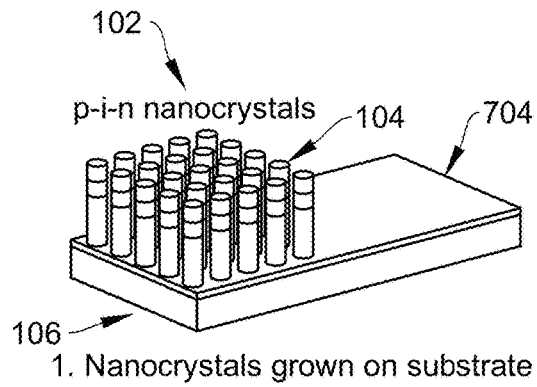
FIGS. 6A, 6B, 6C, 6D, 6E, 6F, 7A, and 7B illustrate an example of steps used to fabricate an NCSEL in embodiments according to the present invention.

In FIG. 6A, the nanocrystal array 102 is grown on the substrate 106. In embodiments, each nanowire or nanocrystal 104 in the nanocrystal array 102 includes an n-GaN cladding layer or region 110, a heterostructure or active region 112, and a p-GaN cladding layer or region 114 as previously described herein (e.g., FIG. 1C).

Figures 7A, 7B:
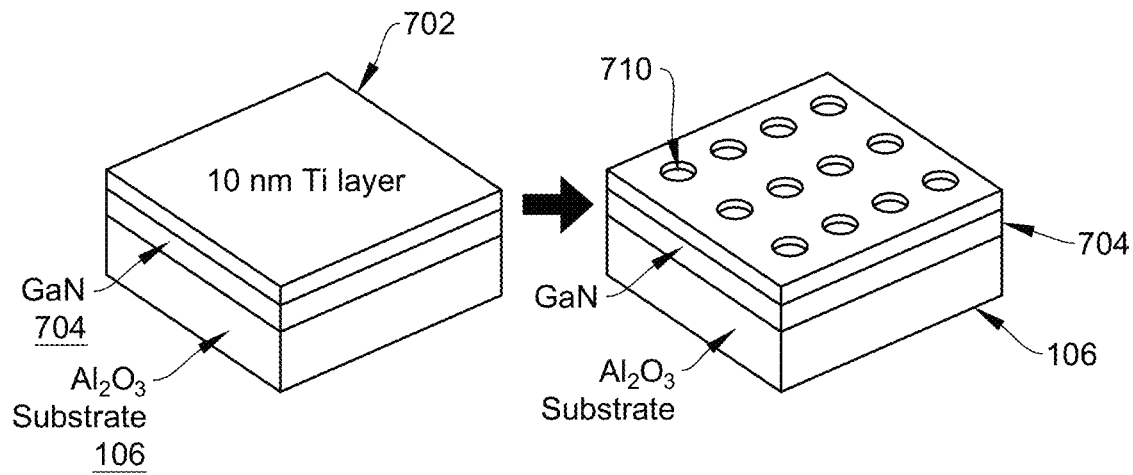

More specifically, with reference to FIG. 7A, a patterned thin film nano-hole mask 702 is fabricated on an n-type GaN template substrate 704 on the substrate 106. In embodiments, the mask 702 is titanium (Ti), and the substrate 106 is aluminum oxide ($Al_2O_3$). In embodiments, the n-type GaN template substrate 704 is four microns (μm) thick, and the mask 702 is ten nm thick. The mask 702 can be deposited on the substrate 704 by an e-beam evaporator system.

In FIG. 7B, a positive poly(methyl methacrylate) (PMMA) is used as a resist layer with a spin-coating technique. An e-beam lithography process is utilized to obtain a uniform array of nano-holes 710. In embodiments, then nano-holes 710 each have a diameter of approximately 180 nm and a lattice constant of 250 nm arrayed in triangular lattices; however, the invention is not so limited. The lateral growth effect is taken into account in the pattern design. Subsequently, a methyl isobutyl ketone:isopropyl alcohol solution may be used for the development process. Thereafter, the exposed area of the mask 702 can be etched down by a reactive ion dry-etching technique. The nano-hole patterned substrate 710 can then be cleaned and loaded into a molecular-beam epitaxy (MBE) growth chamber. Prior to selected area epitaxial growth (SAG) of the GaN nanocrystals, a nitridation step can be performed; consequently, in an embodiment, the mask 702 is converted to a TiN film, which prevents the formation of cracks and degradation at elevated temperatures. In embodiments, the nanocrystal array 102 is grown on the n-type GaN template 704 by radio frequency (RF) plasma-assisted MBE.

With reference again to FIG. 6A, and also to FIGS. 1C and 2A, the InGaN/AlGaN core-shell heterostructures 112 are formed (disposed) in the nanowires 104. First, an InGaN core 122 disk layer is grown on the top surface region of n-GaN nanocrystal 110. Due to the strain-induced self-organization effect, the size of the InGaN disk becomes smaller than the n-GaN nanocrystal diameter. The incorporation of AlGaN barrier layers, instead of GaN barrier layers, leads to the formation of an AlGaN shell structure surrounding the InGaN quantum disk active region, due to the smaller Al adatom diffusion length compared to Ga and In adatom diffusion. As a consequence, the growth fronts including the top and sidewalls of the InGaN region can be covered by AlGaN layers, thereby leading to the spontaneous formation of large band-gap AlGaN shell structures 124. By repeating the growth process, coaxially aligned cone-like AlGaN shell layers 124 can be fabricated surrounding the InGaN multiple quantum disk structures 122.

Figure 8:
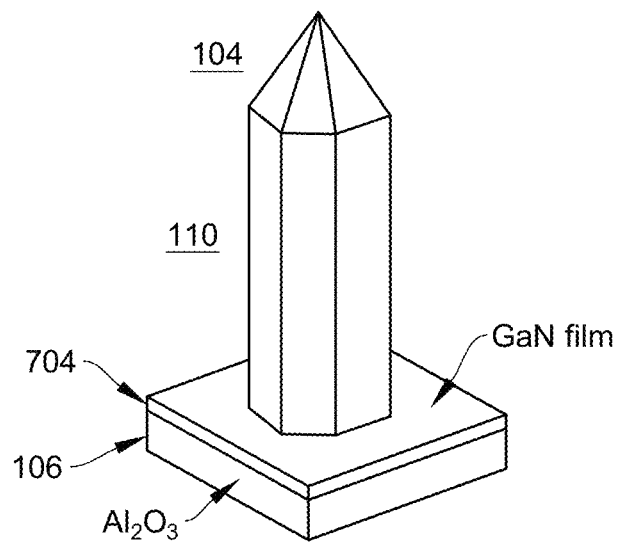
FIG. 8 illustrates a nanocrystal structure in embodiments according to the present invention.

A polarity generally refers to the direction in which GaN grows considering Ga-N bonds that are collinear with the c-axis of the wurtzite crystal structure. The vector from Ga to N-direction defines [0001], which is the positive direction of the c-axis. When the growth direction is [0001] (e.g., Ga-polarity), a pyramidal or cone-like geometry is achieved for the GaN nanowires. Conversely, the structure has N polarity when the growth direction is [000$\bar{1}$], which often exhibits a flat top surface. In the case of GaN wurtzite crystal structures, the polarity depends critically on the growth kinetics, buffer layers, substrates, and growth systems. As shown in FIG. 8, the n-GaN nanocrystals 104 are formed in a pyramidal or conical shape with the Ga-polarity because of the Ga-terminated GaN template on the substrate 106. Consequently, this Ga-polar crystal geometry leads to the formation of a cone-shaped semi-polar multi-quantum disk layers in the active region.

Figure 6B:
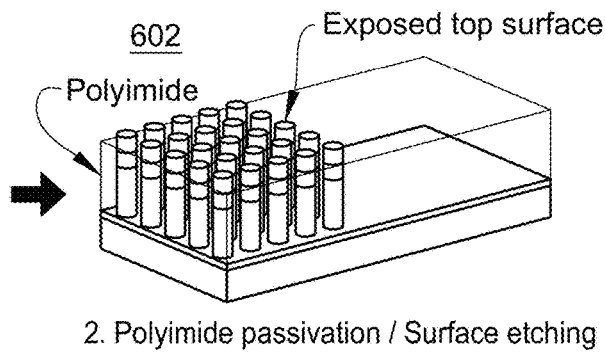
Figure 6C:
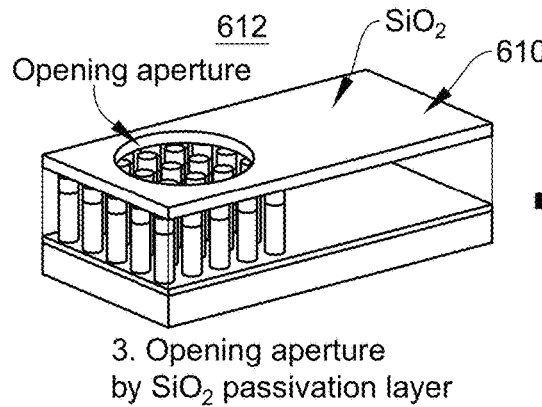
Figure 6D:
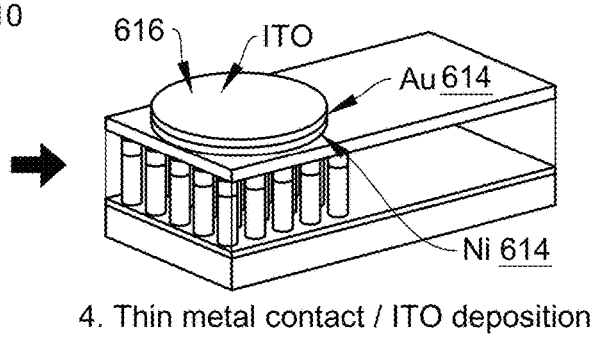
Figure 6E:
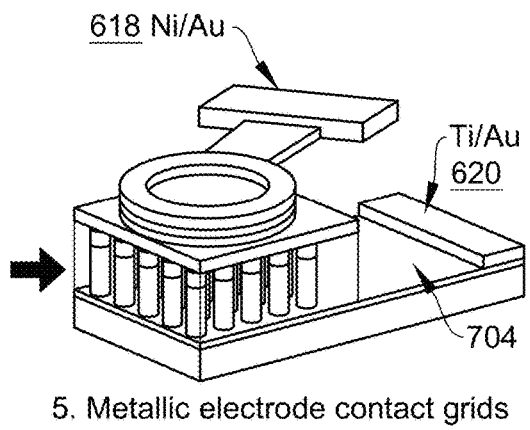

In FIG. 6B, the nanocrystal array 102 is first planarized by a spin-coating system using a polyimide layer 602, followed by plasma etching to expose the top surfaces of the nanocrystals 104. In FIG. 6C, a silicon oxide (SiO$_x$) passivation layer 610 is deposited by plasma-enhanced chemical vapor deposition (PECVD), and the active region area corresponds to the opening aperture 612 on the SiO$_x$ layer. In FIG. 6D, a metal electrode 614 is deposited on the top surfaces of the p-GaN region 114 of the nanocrystals 104 by an e-beam evaporator with an e-beam lithography technique and then annealed. In an embodiment, the electrode 614 consists of nickel (Ni) and gold (Au). Subsequently, an indium tin oxide (ITO) layer 616 is deposited, to serve as a transparent electrode and current spreading layer. The ITO layer 616 is also annealed. In FIG. 6E, contact layers are deposited on the surrounding top surface of the ITO layer 616 and n-GaN template 704 to serve as the p-metal and n-metal contacts 618 and 620. In an embodiment, the p-metal contact 618 consists of Ni and Au, and the n-metal contact 620 consists of Ti and Au. The fabricated devices with metal contacts can then be annealed.

Figure 6F:
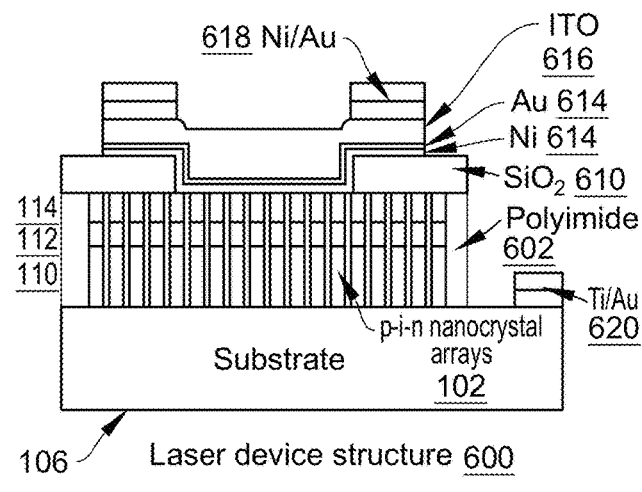

FIG. 6F shows a cross-section of an embodiment of the NCSEL 600 that is fabricated as just described. In the example of FIG. 6F, the ITO layer 616 is light-transmissive, and laser light is emitted vertically in the direction away from the substrate 106 and out of the NCSEL 600 through the ITO layer.

To achieve stable and low resistivity ohmic contact, the thickness of Ni and Au in the contact 620 and the annealing process can be optimized so that, upon annealing, Ni may form NiO$_x$ and become nearly transparent. The thin Au layer, however, does partially block the emitted light. However, it is estimated that the transmittance of the Au metal layer is about 60-70 percent in the green wavelength region, which leads to non-negligible optical loss and limits the optical power.

In an alternate embodiment, the ITO layer 616 is replaced with a light-reflective layer, and the substrate 106 is light-transmissive. That is, the substrate 106 consists of a light-transmissive material instead of, for example, AL$_2$O$_3$. In such an embodiment, laser light is emitted vertically in the direction away from the substrate 106, reflected back toward the substrate by the light-reflective layer, and out of the NCSEL through the substrate.

To summarize, disclosed herein is a new generation of surface-emitting laser diodes utilizing nanocrystals grown from the bottom (substrate) up. Such a unique structure is not fabricated by the conventional top-down approach because the active region is predefined by the film structure. The presence of a clear threshold, sharp linewidth reduction, distinct far-field emission pattern, and polarized light emission provides unambiguous evidence for the achievement of coherent lasing oscillation. Significantly, compared to conventional VCSELs, lasing and surface emission is achieved without using thick, resistive, and often heavily dislocated DBRs. This unique laser concept can be readily extended to achieve all-epitaxial, DBR-free surface-emitting laser diodes operating across the entire visible spectrum as well as mid and deep UV wavelengths, and to realize such lasers on low-cost, large-area wafers (e.g., silicon wafers). Disclosed herein is a new paradigm in the design and development of surface-emitting laser diodes, where the performance is not limited by the availability of DBRs, lattice mismatch, and substrate availability.

Although the subject matter has been described in language specific to structural features and/or methodological acts, it is to be understood that the subject matter defined in the present disclosure is not necessarily limited to the specific features or acts described above. Rather, the specific features and acts described above are disclosed as example forms of implementing the present disclosure.

Embodiments according to the invention are thus described. While the present disclosure has been described in particular embodiments, the invention should not be construed as limited by such embodiments, but rather construed according to the following claims.

What is claimed is:

1. A nanowire, comprising:
    a first semiconductor region;
    a second semiconductor region; and
    a heterostructure disposed between and coupled to the first semiconductor region and the second semiconductor region, the heterostructure including;
        a quantum disk disposed in a first semipolar plane of the nanowire; and
        a shell layer disposed in a second semipolar plane of the nanowire;
    wherein the nanowire is operable for emitting stimulated emission light having a wavelength in a range of 520-560 nanometers at a current density that is at least an order of magnitude less than ten kiloamperes per square centimeter (10 kA/cm$^2$).

2. The nanowire of claim 1, wherein the current density is on the order of 0.4 kA/cm$^2$ and less.

3. The nanowire of claim 1, wherein the first semiconductor region comprises n-doped gallium nitride, and wherein the second semiconductor region comprises p-doped gallium nitride.

4. The nanowire of claim 1, wherein the heterostructure comprises shell layers and quantum disks, and wherein the shell layers comprise aluminum gallium nitride, and the quantum disks comprise indium gallium nitride.

5. The nanowire of claim 1, wherein the heterostructure comprises shell layers and quantum disks, and wherein the quantum disks are interleaved with the shell layers.

6. The nanowire of claim 1, wherein the heterostructure is cone-shaped and is narrower as distance from the substrate increases.

7. The nanowire of claim 1, wherein the nanowire has a transverse cross-section that is hexagonal.

8. A device, comprising:
    a substrate; and
    a surface-emitting laser coupled to the substrate and comprising a nanocrystal array comprising a plurality of nanowires, wherein the plurality of nanowires include;
        an n-type semiconductor region;
        a p-type semiconductor region; and
        a heterostructure between the n-type semiconductor region and the p-type semiconductor region, the heterostructure includes;
            a quantum disk disposed in a first semipolar plane of the nanowire; and
            a shell layer disposed in a second semipolar plane of the nanowire.

9. The device of claim 8, wherein the nanocrystal array comprises an optical cavity.

10. The device of claim 8, wherein the nanowires have a photonic crystalline structure comprising an optical cavity; and wherein, in operation, the photonic crystalline structure is configured to form a standing wave in the photonic crystalline structure without a dynamic Bragg reflector.

11. The device of claim 10, wherein a reciprocal lattice of the photonic crystalline structure comprises six equivalent and coupled Brillouin zone gamma points.

12. The device of claim 10, wherein the nanocrystal array exhibits a uniform photonic band-edge resonant effect in operation.

13. The device of claim 8, wherein the nanowires are operable for emitting stimulated emission light having a wavelength in a range of 520-560 nanometers at a current density that is at least an order of magnitude less than ten kiloamperes per square centimeter.

14. The device of claim 8, wherein the nanowires are operable for emitting stimulated emission light having a wavelength in a range selected from the group consisting of: 10-400 nanometers; and 635-700 nanometers.

15. The device of claim 8, wherein the nanocrystal array includes multiple rows of the nanowires, wherein each row includes multiple nanowires, wherein each nanowire of the plurality of nanowires has a transverse cross-section that is hexagonal, and wherein the nanowires are arranged in a triangular lattice in the array.

16. A monolithic device, comprising:
a substrate layer; and
a plurality of nanowires coupled to the substrate layer, wherein the plurality of nanowires include;
a heterostructure including a quantum disk disposed in a first semipolar plane of the nanowire, and a shell layer disposed in a second semipolar plane of the nanowire.

17. The device of claim 16, further comprising an n-type semiconductor layer disposed on the substrate layer and comprising a uniform array of holes, wherein each nanowire of the plurality of nanowires extends from a respective hole of the array of holes.

18. The device of claim 16, wherein the nanowires have uniform diameters, lengths, and shapes and are uniformly spaced within the nanostructure array.

19. The device of claim 16, further comprising a light-transmissive layer coupled to the nanostructure array.

20. The device of claim 16, wherein the substrate layer is light-transmissive.

21. The device of claim 16, wherein the nanowires are operable for emitting stimulated emission light having a wavelength in a range of 520-560 nanometers.

22. The device of claim 16, wherein the plurality of nanowires coupled to the substrate comprise a nanocrystal surface-emitting laser (NCSEL) diode.

23. The device of claim 16, wherein:
the plurality of nanowires are arranged in an array including multiple rows of the nanowires, and each row includes multiple nanowires;
each nanowire of the plurality of nanowires has a transverse cross-section dimension of 230 nanometers (nm), and a spacing of 30 nm between the plurality of nanowires;
the quantum disk comprises an Indium Gallium Nitride (InGaN) quantum disk; and
the shell layer comprises an Aluminum Gallium Nitride (AlGaN) shell layer.

* * * * *